United States Patent
Chen et al.

(10) Patent No.: US 12,426,205 B2
(45) Date of Patent: Sep. 23, 2025

(54) IMMERSION COOLING RACK WITH DRAIN CONTROL

(71) Applicant: Quanta Computer Inc., Taoyuan (TW)

(72) Inventors: Chao-Jung Chen, Taoyuan (TW); Yu-Nien Huang, Taoyuan (TW); Herman Tan, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 215 days.

(21) Appl. No.: 18/471,206

(22) Filed: Sep. 20, 2023

(65) Prior Publication Data

US 2025/0040081 A1 Jan. 30, 2025

Related U.S. Application Data

(60) Provisional application No. 63/515,535, filed on Jul. 25, 2023.

(51) Int. Cl.
*H05K 7/20* (2006.01)

(52) U.S. Cl.
CPC ..... *H05K 7/20272* (2013.01); *H05K 7/20236* (2013.01); *H05K 7/20781* (2013.01)

(58) Field of Classification Search
CPC .......... H05K 7/20781; H05K 7/20272; H05K 7/20236; H05K 7/203; H05K 7/20872; H05K 7/20881; H05K 7/20927; H05K 7/20672; H05K 7/20636; H05K 7/20536; H05K 7/20281; G06F 1/20; G06F 2200/201; F28F 2265/06
See application file for complete search history.

(56) References Cited

U.S. PATENT DOCUMENTS

| | | | |
|---|---|---|---|
| 11,044,834 B1* | 6/2021 | Lau | H05K 7/20772 |
| 2017/0325358 A1* | 11/2017 | Franz | H05K 7/20781 |
| 2018/0242478 A1* | 8/2018 | Cui | H01R 3/08 |
| 2021/0274687 A1* | 9/2021 | Chen | H05K 7/20272 |
| 2021/0385978 A1* | 12/2021 | Shao | H05K 7/1489 |
| 2023/0363117 A1* | 11/2023 | Gupta | H05K 7/20736 |

* cited by examiner

*Primary Examiner* — Mandeep S Buttar
(74) *Attorney, Agent, or Firm* — NIXON PEABODY LLP (57) ABSTRACT

An information technology (IT) system is directed to immersion cooling and includes a chassis forming an enclosure between an upstream side and a downstream side. The chassis has a rear opening formed along the downstream side and is configured to receive heat-generating components of the IT system adjacent to the upstream side within the enclosure. The system further includes a supply conduit for delivering an immersion coolant to the upstream side within the enclosure, and a flap mechanism attached to the downstream side near the rear opening. The flap mechanism is movable between an open position and a closed position, which allows accumulated coolant to drain from the chassis in the open position and prevents the accumulated coolant from draining from the chassis in the closed position.

20 Claims, 13 Drawing Sheets

IMMERSION COOLING RACK WITH DRAIN CONTROL

RELATED APPLICATIONS

This application claims priority to and the benefit of U.S. Provisional Application No. 63/515,535, filed on Jul. 25, 2023, which is incorporated herein by reference in its entirety.

FIELD OF THE INVENTION

The present invention relates generally to immersion cooling of an information technology ("IT") system, and more specifically, to draining coolant from a computer equipment rack chassis.

BACKGROUND OF THE INVENTION

IT systems, including server systems, require cooling to prevent overheating. Immersion cooling for the IT system is one preferred method of cooling, which requires suspending components of the IT system (e.g., mainboard, processors storage devices, add-on-card, power supply unit) in a tank that is filled with a cooling liquid that immerses the components. The cooling liquid acts as a medium for dissipating heat generated from the components of the IT system. However, physical space (e.g., existing industrial rack or cabinet footprint) and budgets associated with present immersion cooling of IT systems are severely limited, resulting in drastic efficiency and cost problems with the present immersion cooling techniques. The present disclosure provides a solution for these and other problems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, an information technology (IT) system is directed immersion cooling, and includes a chassis that forms an enclosure between an upstream side and a downstream side. The chassis has a rear opening formed along the downstream side, and is configured to hold heat-generating components of the IT system adjacent to the upstream side within the enclosure. The system further includes a supply conduit for delivering an immersion coolant to the upstream side within the enclosure. The system further includes a flap mechanism attached to the downstream side near the rear opening. The flap mechanism is movable between an open position and a closed position. The flap mechanism allows accumulated coolant to drain from the chassis in the open position, and prevents the accumulated coolant from draining from the chassis in the closed position.

According to some features of the above aspects, the flap mechanism rotates along a pivoting axis to move between the open position and the closed position. According to other features of the above aspects, the pivoting axis is along a flap rod attached between two opposing sides of the rear opening.

According to yet other features of the above aspects, the IT system further includes a flap handle that is mechanically coupled to a flap door. The flap handle causes the flap door to rotate when actuated. According to yet other features of the above aspects, the flap handle has a first end that is coupled to a bottom side of the flap door, and a second end that protrudes externally from the upstream side. According to yet other features of the above aspects, the flap handle is movable away from the upstream side to cause the flap door to rotate towards the open position, resulting in the draining of the accumulated coolant.

According to yet other features of the above aspects, the IT system further includes an outlet duct connecting the rear opening to a coolant drainage source.

According to yet other features of the above aspects, the IT system further includes a quick-disconnect connector coupling the supply conduit to a coolant supply source. According to yet other features of the above aspects, the quick-disconnect connector is mounted along the downstream side.

According to yet other features of the above aspects, the chassis is slidably mounted within a computing rack, the computing rack being configured to house at least one additional chassis.

According to other aspects of the present disclosure, a computing assembly is directed to immersion cooling and includes a computing rack configured to house a plurality of information technology (IT) systems. The computing assembly further includes a coolant supply manifold positioned along one end of a downstream side, and a coolant draining manifold positioned along an opposite end of the downstream side. The computing assembly further includes a plurality of chassis slidably mounted within the computing rack, each chassis of the plurality of chassis being configured to receive a respective IT system of the plurality of IT systems. Each chassis forms an enclosure between an upstream side and a downstream side and has a rear opening formed along the downstream side. Each chassis further has a supply conduit fluidly coupled to the coolant supply manifold for delivering an immersion coolant to the upstream side within the enclosure. Each chassis further has a flap mechanism attached to the downstream side near the rear opening. The flap mechanism is movable between an open position and a closed position, allowing accumulated coolant to drain from the respective chassis into the coolant draining manifold in the open position, and prevent the accumulated coolant from draining from the respective chassis into the coolant draining manifold in the closed position.

According to some features of the above aspects, the coolant supply manifold and the coolant draining manifold are mounted generally vertically along the downstream side.

According to other features of the above aspects, the coolant supply manifold and the coolant draining manifold are mounted generally parallel to each other along the downstream side.

According to yet other features of the above aspects, each chassis is mounted generally horizontally and in parallel with an adjacent chassis in the computing rack.

According to yet other features of the above aspects, each chassis is configured to hold heat-generating components that include one or more of an application server, a storage server, a computer server, a storage device, or a network switch.

According to yet other aspects of the present disclosure, a method is directed to immersion cooling of an information technology (IT) system, and includes providing a chassis that forms an enclosure between an upstream side and a downstream side. The chassis has a rear opening formed along the downstream side. The method further includes receiving heat-generating components of the IT system into the chassis, the heat-generating components being positioned adjacent to the upstream side within the enclosure. The method further includes delivering an immersion coolant to the upstream side within the enclosure. The method further includes moving a flap mechanism between an open position and a closed position. The flap mechanism is attached to the downstream side near the rear opening. Movement of the flap mechanism allows accumulated coolant in the enclosure to drain from the chassis in the open position, and prevents the accumulated coolant from draining from the chassis in the closed position.

According to some features of the above aspects, the method further includes rotating the flap mechanism along a pivoting axis.

According to other features of the above aspects, the method further includes moving a flap handle that is mechanically coupled to a flap door, movement of the flap handle causing the flap door to rotate between the open position and the closed position.

According to yet other features of the above aspects, the method further includes draining the accumulated coolant into a draining manifold, the draining manifold being fluidly coupled to the rear opening via an outlet duct.

According to yet other features of the above aspects, the method further includes receiving the immersion coolant from a supply manifold, the supply manifold being fluidly coupled to a supply conduit via a quick-disconnect connector.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1A:
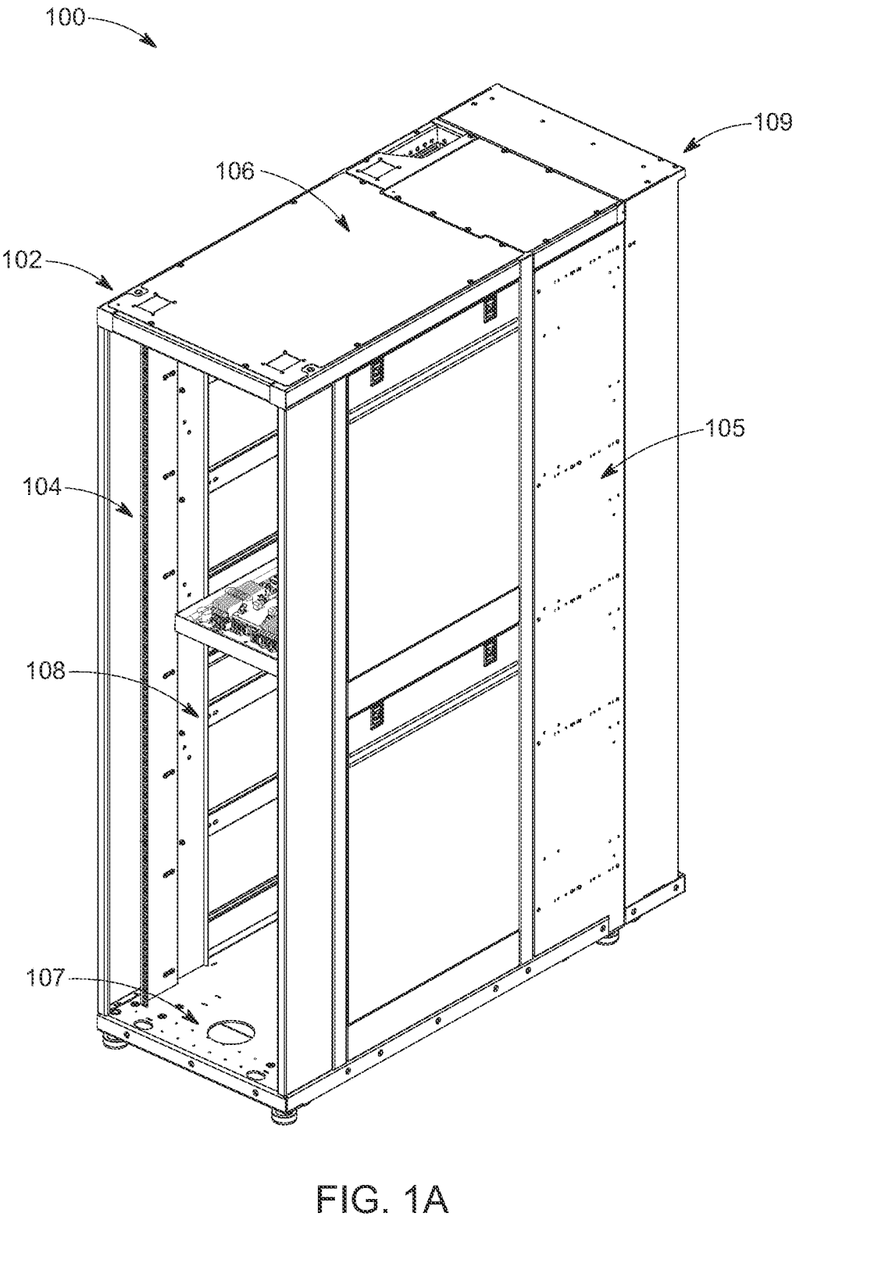
FIG. 1A is a perspective view of a rack for an IT system, according to certain aspects of the present disclosure.

Referring to FIG. 1A, an IT system 100 includes a equipment rack 102 that generally forms a cabinet enclosure for housing various IT components. The rack 102 has a left side 104, a right side 105, a top side 106, and a bottom side 107. The enclosed IT components are accessible via one or more of a front opening 108 and a back opening 109.

Figure 1B:
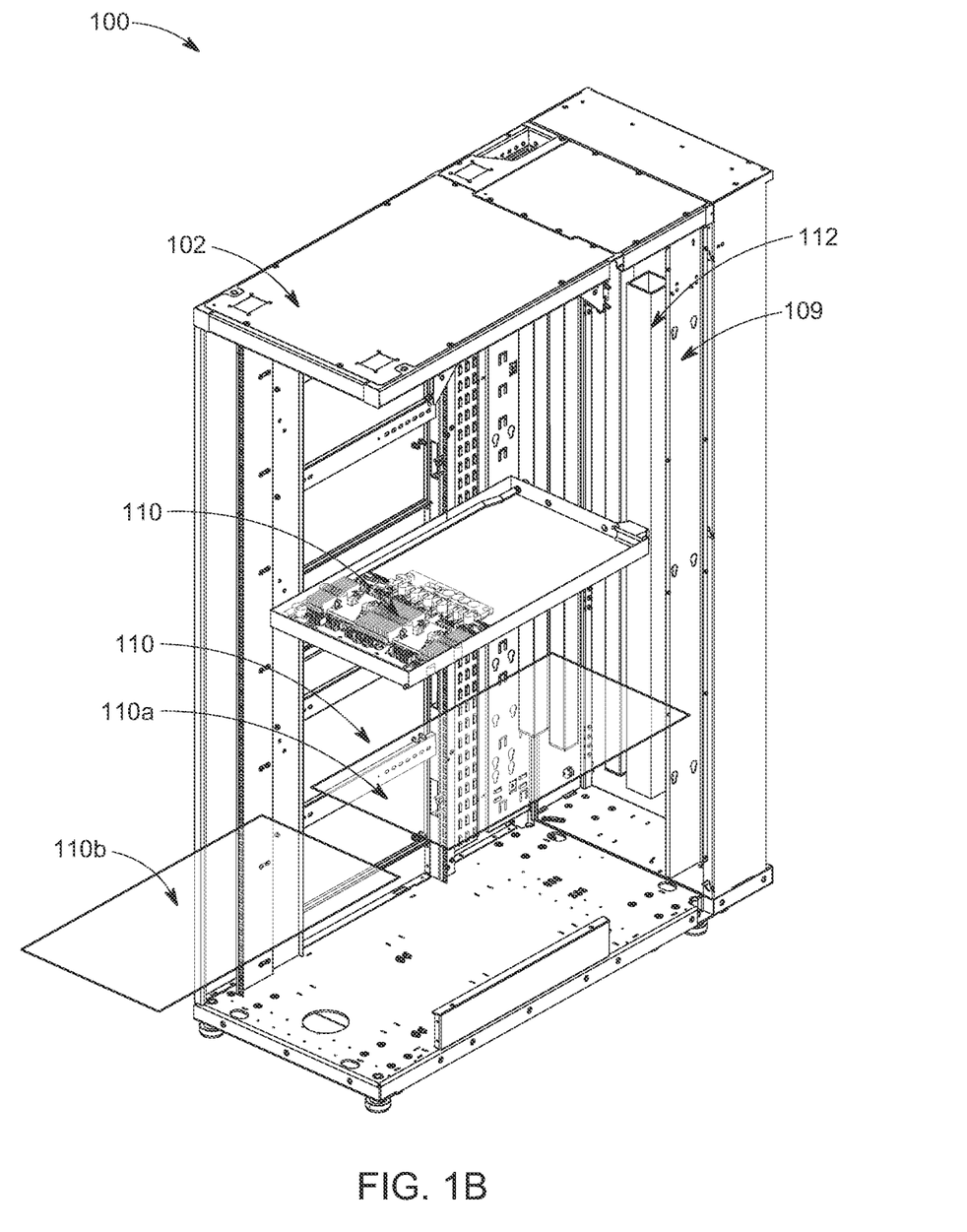
FIG. 1B is a perspective view of the rack of FIG. 1A illustrating some internal components, according to certain aspects of the present disclosure.

Referring to FIG. 1B, the IT system 100 includes a plurality of chassis 110 within the rack 102. For ease of understanding, only one chassis 110 will be further described and illustrated in more detail. Each chassis 110 is in fluid communication with a plurality of coolant manifolds 112. The coolant manifolds 112 are mounted near the back opening 109 of the rack 102. The chassis 110 may be configured for receiving computer components such as application servers, storage servers, computer servers, storage devices, switches, routers and the like.

Optionally, the chassis 110 is mounted in the rack 102 in a slidable configuration to facilitate case of service when needed. For example, the chassis 110 is slidable between an enclosed position 110a and a serviceable position 110b. Optionally, each chassis 110 is mounted generally horizontally in the rack 102. In another optional configuration, each chassis 110 is positioned generally parallel to an adjacent chassis 110 in the rack 102. In another optional configuration, each chassis 110 is slotted in the rack 102.

Figure 2:
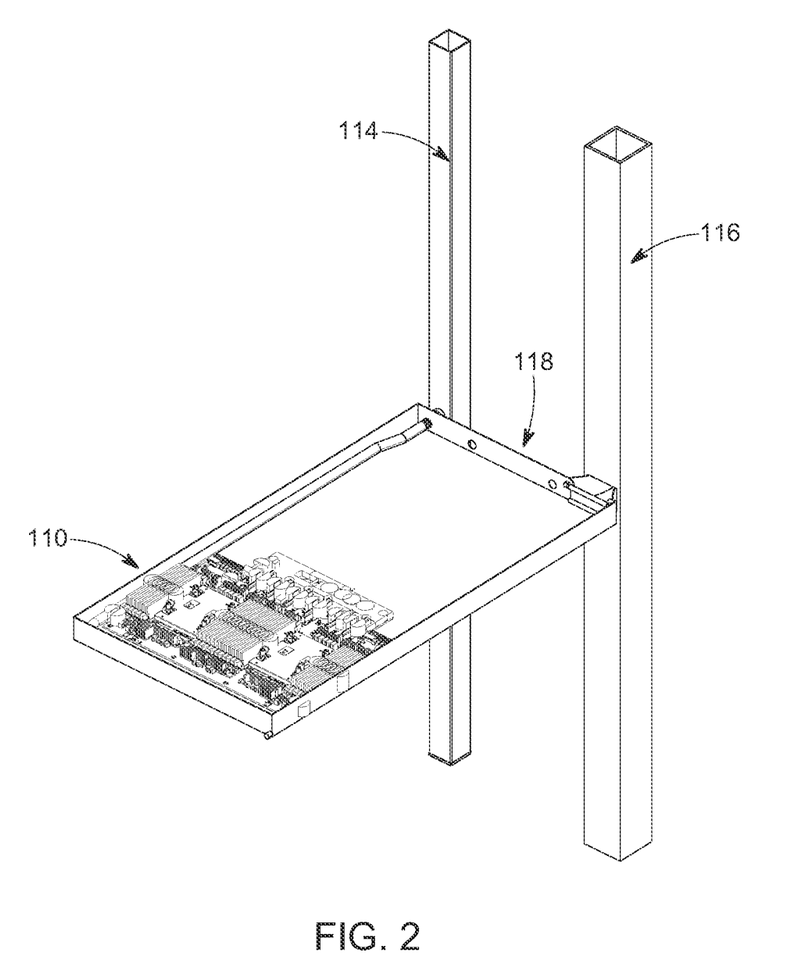
FIG. 2 is a perspective view of a chassis and coolant manifolds for the IT system of FIG. 1A, according to certain aspects of the present disclosure.

Referring to FIG. 2, the chassis 110 is coupled to a supply manifold 114 and a drainage manifold 116. The manifolds 114, 116 are part of the coolant manifolds 112 (referred to in FIG. 1B) and are mounted near a downstream side 118 of the chassis 110. Optionally, the manifolds 112 are mounted generally vertically along the downstream side 118. In another optional configuration, the manifolds 112 are mounted generally parallel to each other along the downstream side 118.

Figure 3A:
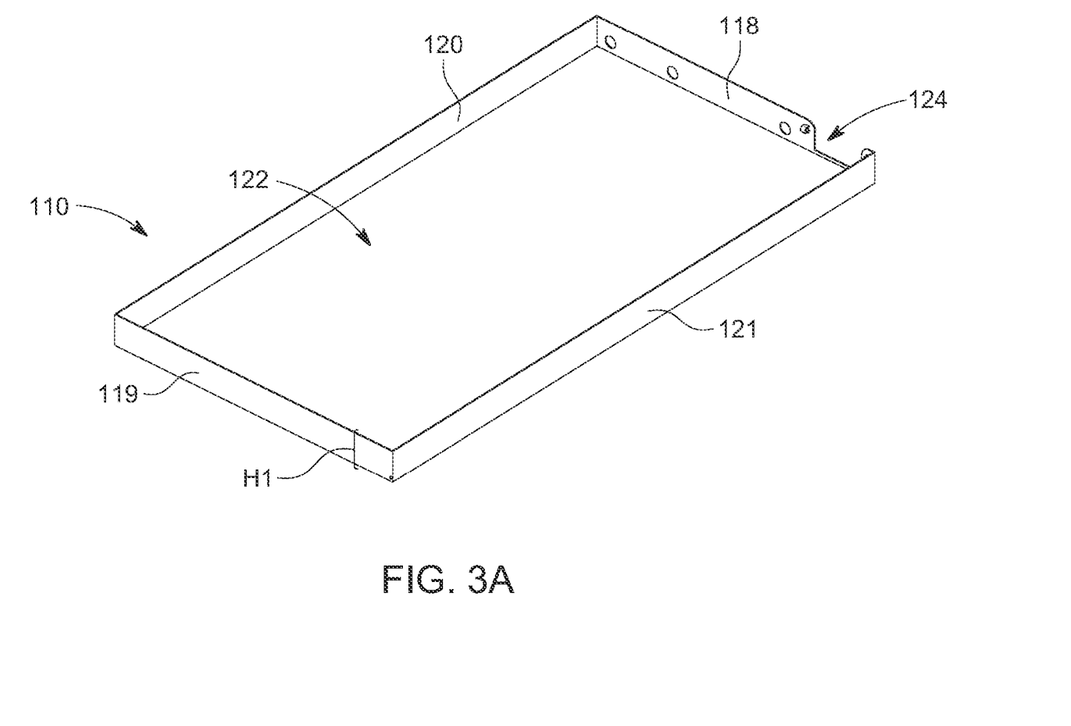
FIG. 3A is a perspective of the chassis of FIG. 2, according to certain aspects of the present disclosure.

Referring to FIG. 3A, the chassis 110 is generally in the form of a tray that has a plurality of sides, including the downstream side 118, an upstream side 119, a left side 120, and a right side 121. Optionally, the tray includes a top side to fully enclose the four sides 118-121 and form the tray in a generally water-tight compartment, except for the overflow path 166e and drainage path 166f discussed below in reference to FIGS. 10A-10C. The top side is not shown here for clarity purposes.

Each of the four sides 118-121 is continuously connected to from an internal enclosure 122 in which an immersion coolant is delivered. According to the illustrated embodiment, each of the four sides 118-121 forms a respective wall having a height H1 that may be a standard server unit height U. The downstream side 118 has a rear opening 124, which (as described below in reference to FIG. 9B) provides an outlet for draining the immersion coolant from the chassis 110.

Figure 3B:
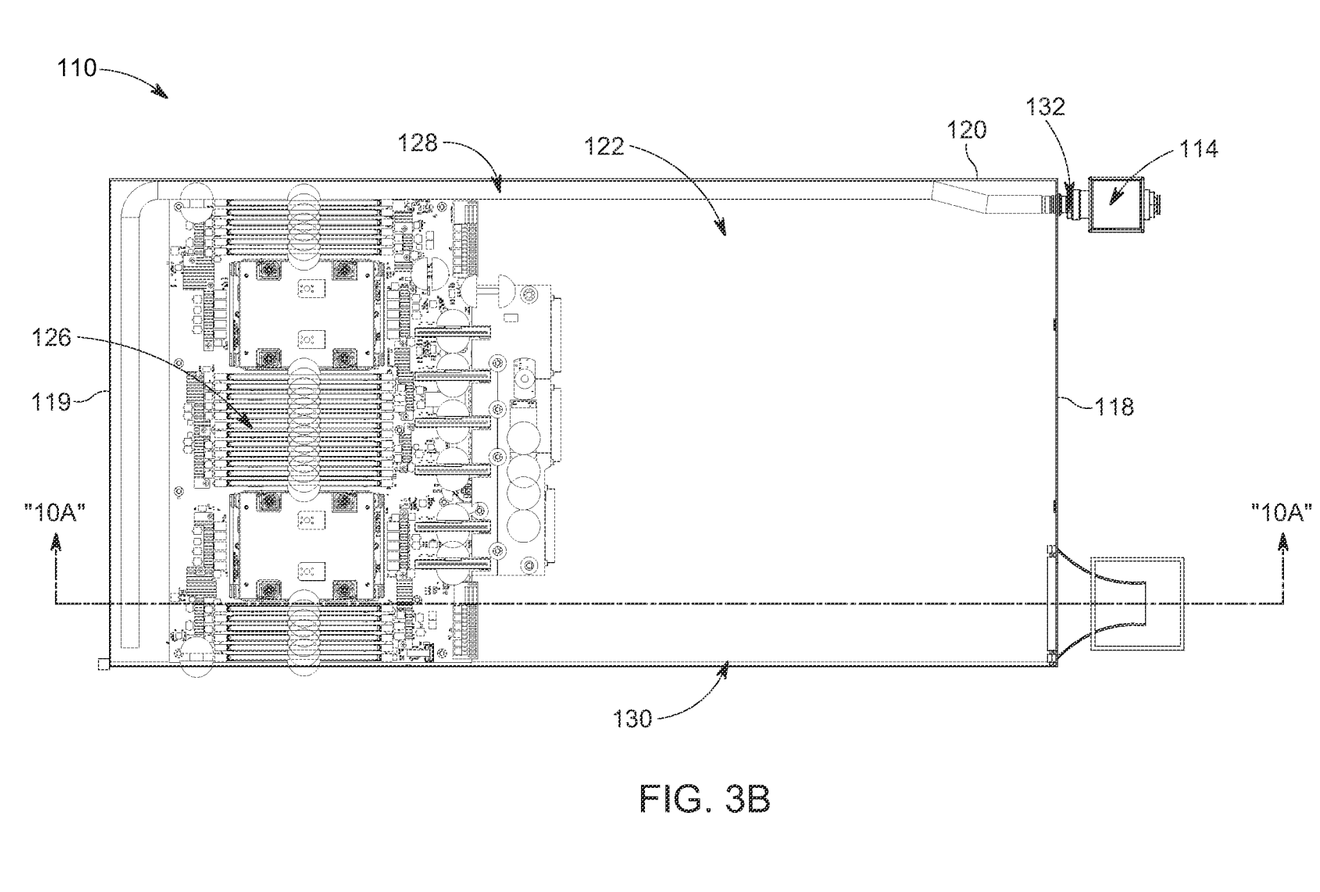
FIG. 3B is a top view of the chassis of FIG. 2, including IT components, according to certain aspects of the present disclosure.

Referring to FIG. 3B, the chassis 110 includes one or more heat-generating components 126, a supply conduit 128, and a flap handle 130, within the enclosure 122. The heat-generating components 126 are mounted adjacent to the upstream side 119, within the enclosure 122. The supply conduit 128 delivers an immersion coolant to the upstream side 119 within the enclosure 122 (as described below in reference to FIG. 9A).

The supply conduit 128 is fluidly coupled to the supply manifold 114 via a quick-disconnect connector 132. The quick-disconnect connector 132 is mounted along the downstream side 118, near the left side 120. The quick-disconnect connector 132 facilitates quick, easy, and toolless connection and disconnection of the supply conduit 128 from the supply manifold 114. The supply manifold 114 is generally a coolant supply source that delivers the immersion coolant to the supply conduit 128. For example, the supply manifold 114 supplies fresh cold liquid coolant into each chassis 110.

Figure 4A:
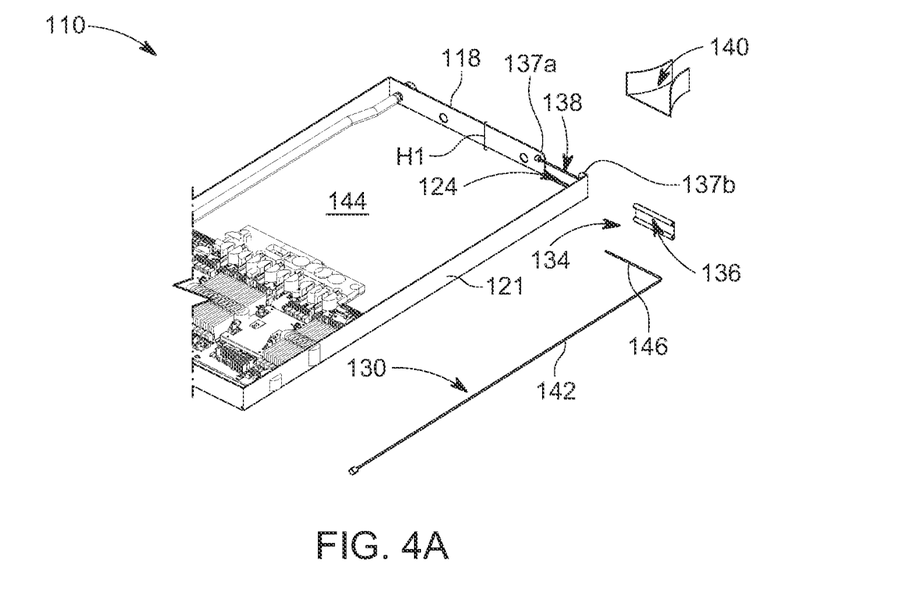
FIG. 4A is an exploded perspective view illustrating a flap mechanism of the chassis of FIG. 2, according to certain aspects of the present disclosure.

Referring to FIG. 4A, the chassis 110 has a flap mechanism 134 that includes the flap handle 130 and a flap door 136. The flap door 136 is rotatably coupled to the chassis 110 via a flap rod 138, which extends across the rear opening 124 near (but below) the height H1 of the downstream side 118. The flap door 136 extends between two opposing sides 137a, 137b of the rear opening 124. The chassis 110 further has an outlet duct 140 mounted to the rear opening 124 for draining the immersion coolant (as described below in reference to FIG. 9B).

The flap handle 130 has a lever portion 142 that extends along the right side 121 of the chassis 110, near a bottom side 144 of the chassis 110. The lever portion 142 is continuously connected in a general perpendicular configuration with an actuator portion 146. In turn, the actuator portion 146 is coupled to the flap door 136, for moving the flap door 136.

Figure 4B:
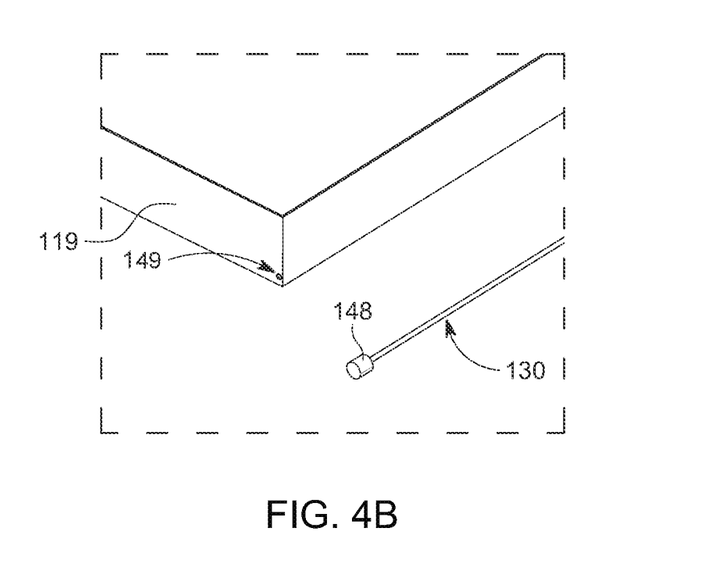
FIG. 4B is a partial perspective view showing a knob portion of the flap mechanism of FIG. 4A, according to certain aspects of the present disclosure.

Referring to FIG. 4B, the flap handle 130 has a knob 148 that extends outwardly from a handle hole 149, which is located in the upstream side 119. The knob 148 is designed to be pulled or pushed, as required, by an operator to move the flap handle 130 between open and closed positions (as described below in reference to FIGS. 8A and 8B), via pulling or pushing the lever portion 142 and the actuator portion 146.

Figure 5:
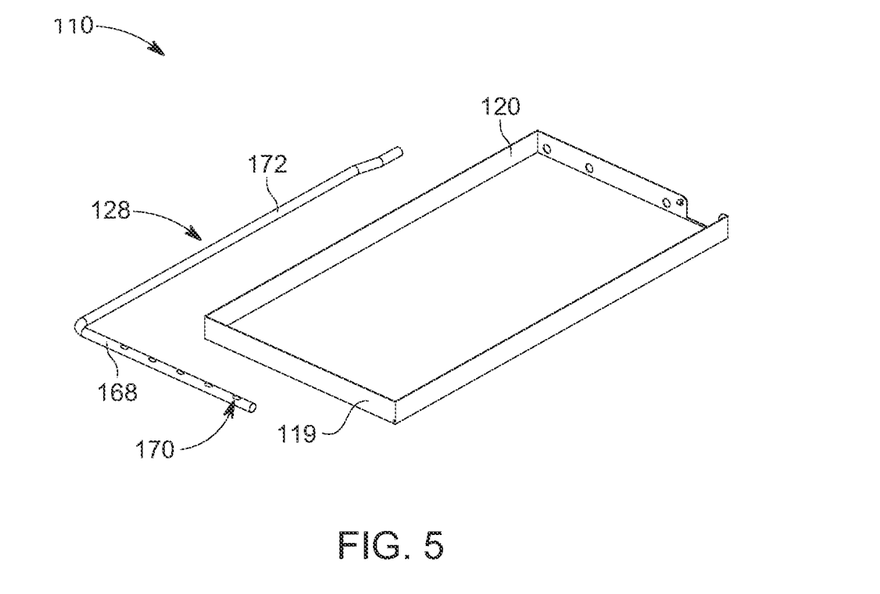
FIG. 5 is an exploded perspective view showing the chassis of FIG. 2 and a supply conduit, according to certain aspects of the present disclosure.

Referring to FIG. 5, the supply conduit 128 follows in part the L-shape configuration between the left side 120 and the upstream side 119 of the chassis 110. The supply conduit 128 has a general L-shape with an upstream member 168 that is generally parallel with and adjacent to the upstream side 119. The upstream member 168 is continuous with and generally perpendicular to a lateral member 172. The lateral member 172 is generally parallel with and adjacent to the left side 120.

The upstream member 168 includes a plurality of supply holes 170 for distributing the immersion coolant 166 to fill the enclosure 122. According to an optional feature, the supply holes 170 are in the form of supply nozzles. According to another optional embodiment, the supply conduit 128 is in part or in its entirety a tubular conduit with a generally circular cross-sectional profile.

Figure 6:
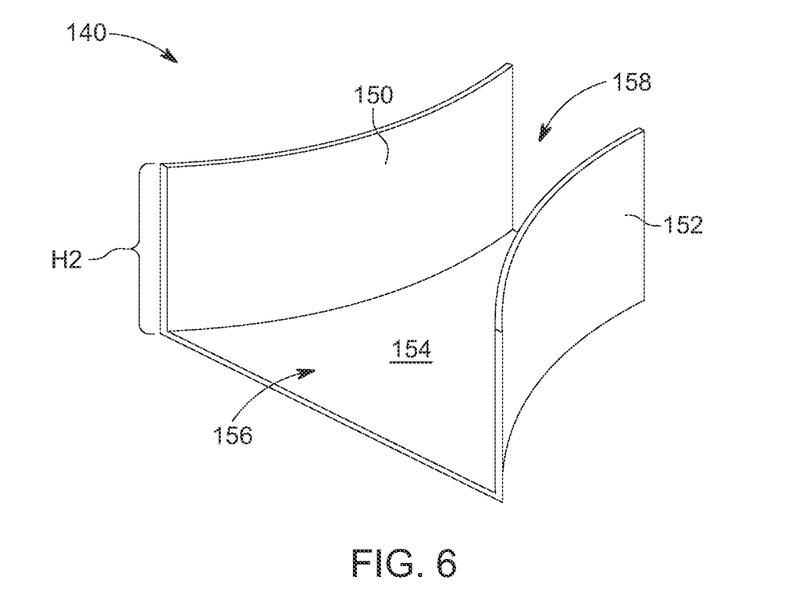
FIG. 6 is a perspective view of an outlet duct coupled to the flap mechanism of FIG. 4A, according to certain aspects of the present disclosure.

Referring to FIG. 6, the outlet duct 140 has two curved sides 150, 152 extending generally perpendicular from a duct base 154. The curved sides 150, 152 flare inwardly from a connecting side 156 to an outlet side 158. Thus, the connecting side 156 is larger than the outlet side 158, achieving a funneling effect when draining the immersion coolant. Each of the curved sides 150, 152 has a height H2 that is generally the same as the height H1 of the chassis 110.

Figure 7:
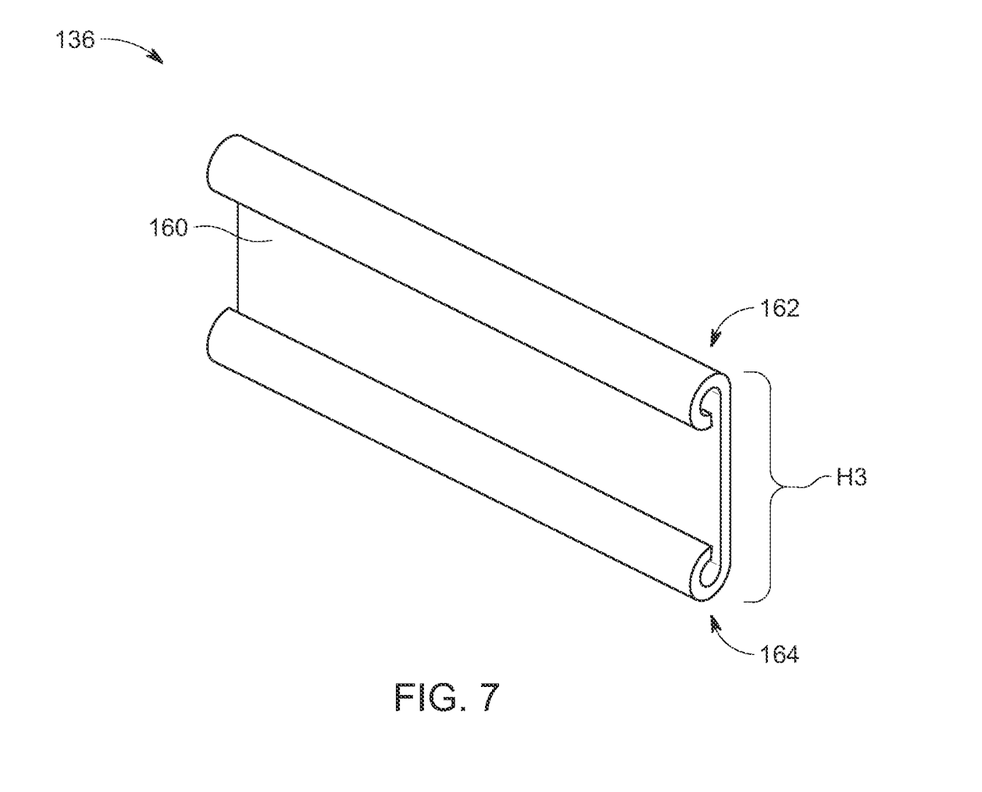
FIG. 7 is a perspective view of a flap door for the flap mechanism of FIG. 4A, according to certain aspects of the present disclosure.

Referring to FIG. 7, the flap door 136 is generally in the form of a plate 160 having a height H3 that does not fully block the rear opening 124. The height H3 is smaller than the height H1 of the four sides 118-121. At opposing ends of the plate 160, along the height H3, the flap door 136 has inwardly curved ends 162, 164. The inwardly curved ends 162, 164 include a pivoting end 162 and an actuating end 164. The pivoting end 162 is configured with an internal hole, which receives within the flap rod 138, and the actuating end 164 is configured with a similar internal hole, which receives securely within the actuator portion 146 of the flap handle 130.

Figure 8A:
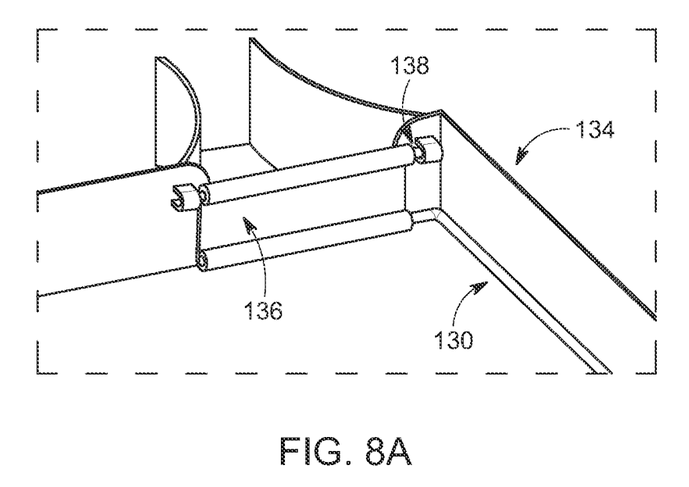
FIG. 8A is a perspective view illustrating the flap mechanism of FIG. 4A in a closed position, according to certain aspects of the present disclosure.
Figure 8B:
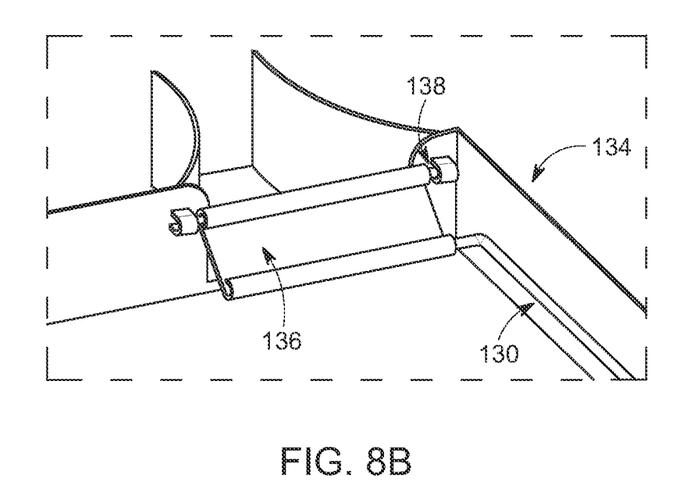
FIG. 8B is a perspective view illustrating the flap mechanism of FIG. 4A in an open position, according to certain aspects of the present disclosure.

Referring to FIGS. 8A and 8B, the flap mechanism 134 is movable between a closed position (illustrated in FIG. 8A) and an open position (illustrated in FIG. 8B). In the closed position, the flap mechanism 134 prevents accumulated coolant from draining from the chassis 110. In the open position, the flap mechanism 134 allows accumulated coolant to drain from the chassis 110.

More specifically, the flap door 136 of the flap mechanism 134 rotates along a pivoting axis, which is along and coincident with the axis of the flap rod 138. The rotation of the flap door 136 along the pivoting axis 138 moves the flap door 136 between the open and closed positions.

The movement of the flap door 136 is achieved via a pulling or pushing force of the flap handle 130, to which the flap door 136 is connected. When the flap handle 130 moves away from the upstream side 119, the flap handle 130 causes the flap door 136 to rotate towards the open position, which results in draining of accumulated coolant.

Figure 9A:
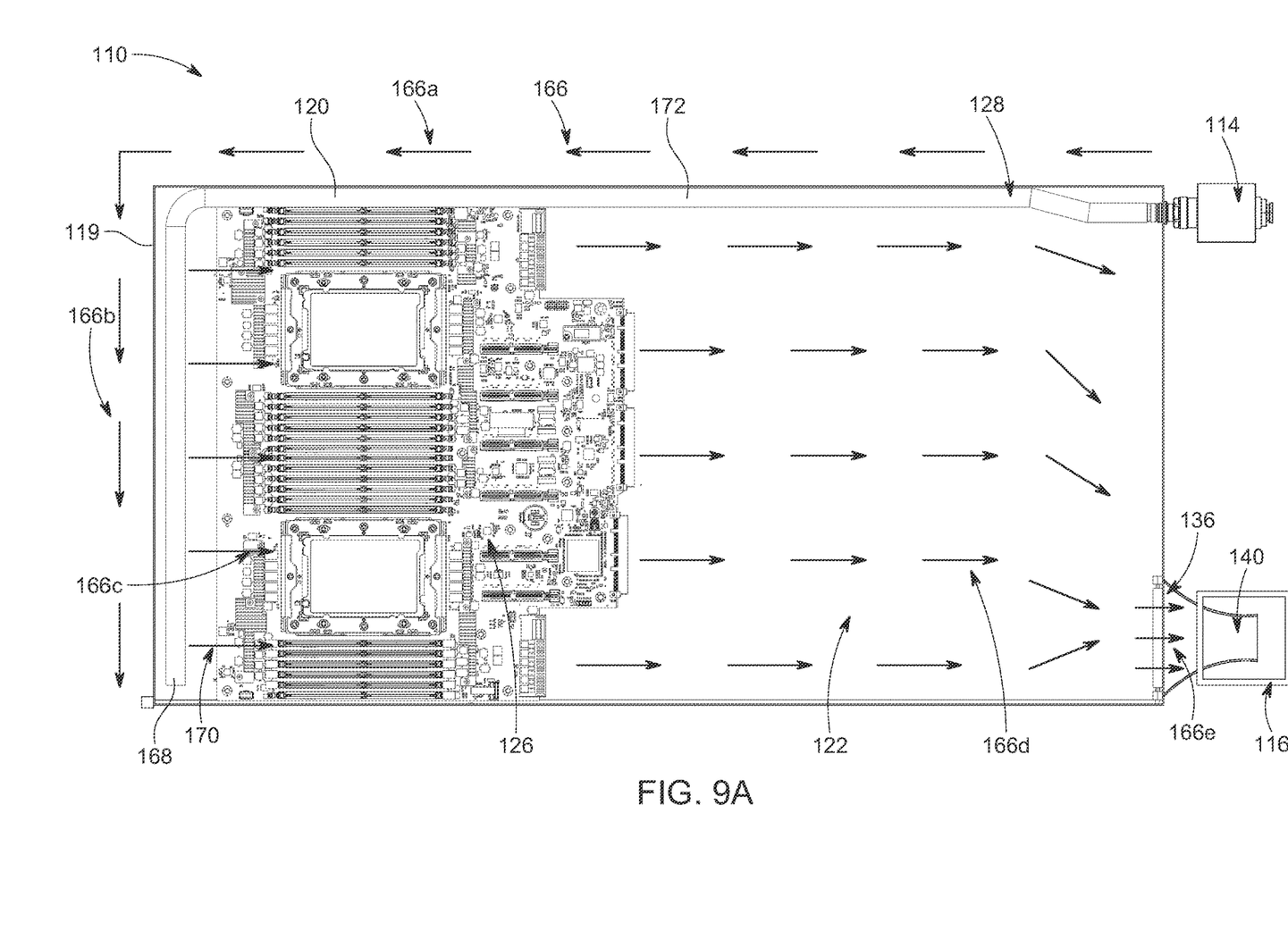
FIG. 9A is a top view illustrating coolant flow in the chassis of FIG. 3B, according to certain aspects of the present disclosure.

Referring to FIG. 9A, an immersion coolant 166 fills the enclosure 122 of the chassis 110, in a default cooling operating state. The immersion coolant 166 is supplied via the supply conduit 128. Specifically, the upstream member 168 of the supply conduit 128 supplies the immersion coolant 166 via the supply holes 170.

The immersion coolant 166 is delivered from the supply manifold 114, filling up the enclosure 122 to cool the heat-generating components 126. In other words, the heat-generating components 126 are fully immersed in the immersion coolant 166.

The flow path of the immersion coolant 166 includes an initial path 166a along the lateral member 172, a secondary path 166b along the upstream member 168, a cooling path 166c over the heat-generating components 126, and a non-cooling path 166d past the heat-generating components 126.

If coolant overflow occurs, the flow path of the immersion coolant 166 includes an overflow path 166e in which some of the immersion coolant 166 flows above the flap door 136 and into the outlet duct 140 (as more clearly illustrated below in reference to FIGS. 10A-10C). In turn, the immersion coolant 166 continues to drain into the drainage manifold 116. Notably, the overflow occurs only while the flap door 136 is in the closed position.

The drainage manifold 116 collects coolant, e.g., liquid, in the cooling path 166c that passes over the heat-generating components 126 and changes fresh, cool coolant into heated coolant. The drainage manifold 116 routes the heated coolant to a heat exchanger system (not shown) to dissipate the heat carried in the heated coolant and provide fresh cold coolant. The heat exchanger system may include pump mechanisms to circulate the coolant and heat exchange infrastructure such as fans or liquid to liquid heat transfer to dissipate the heat from the heated coolant.

Figure 9B:
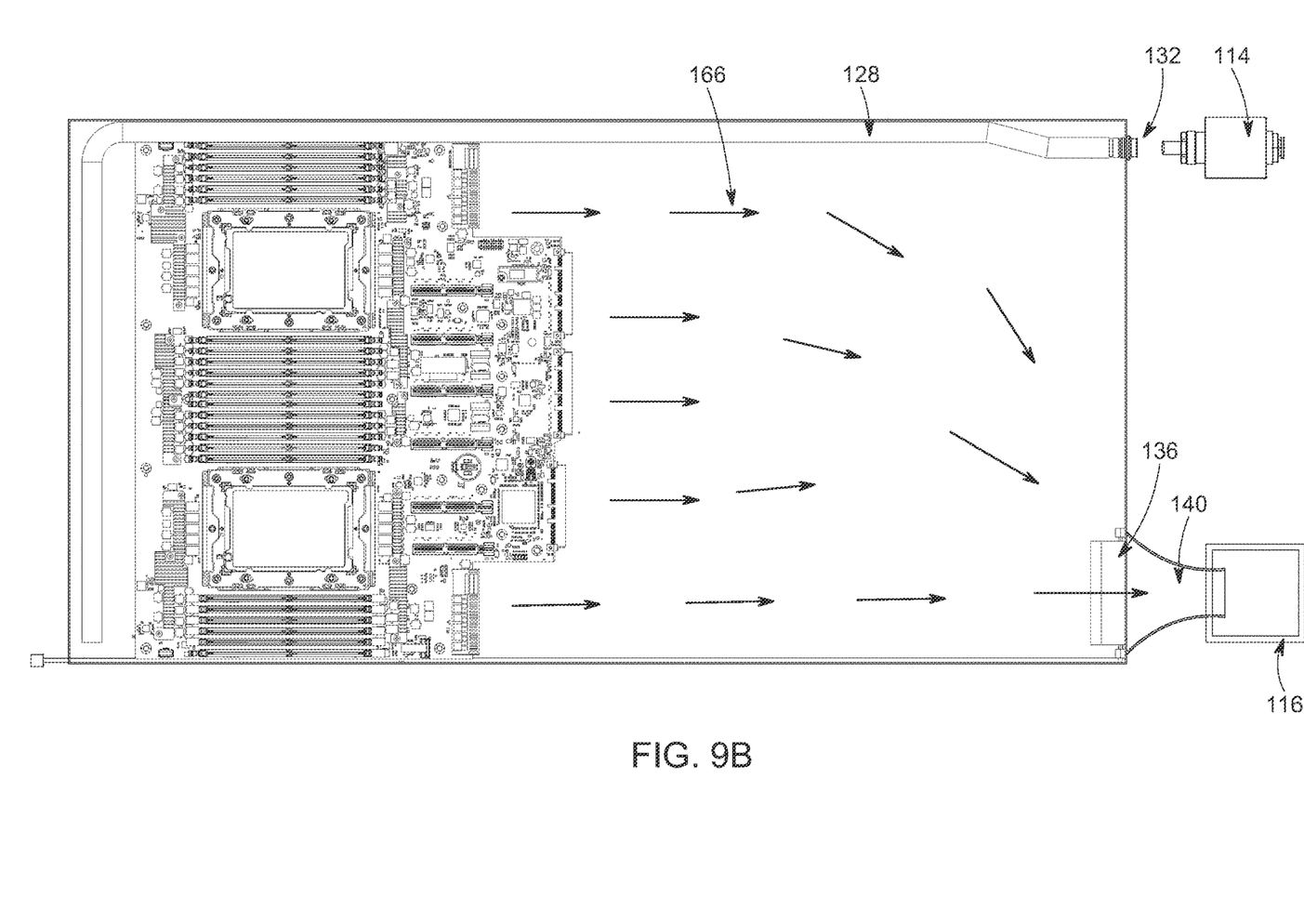
FIG. 9B is a top view illustrating draining of coolant in the chassis of FIG. 3B, according to certain aspects of the present disclosure.

Referring to FIG. 9B, the immersion coolant 166 is illustrated in a draining operating state, in which the flap door 136 has been moved to the open position. The flow of the immersion coolant 166 is stopped, for example, by disconnecting the quick-disconnect connector 132. The disconnection effectively stops flow into the supply conduit 128 from the supply manifold 114.

After stopping the flow of the immersion coolant 166, the flap door 136 is moved to the open position. Consequently, the accumulated coolant 166 in the enclosure 122 moves through the opening facilitated by the open flap door 136, into the outlet duct 140, and, then, into the drainage manifold 116.

Figure 10A:
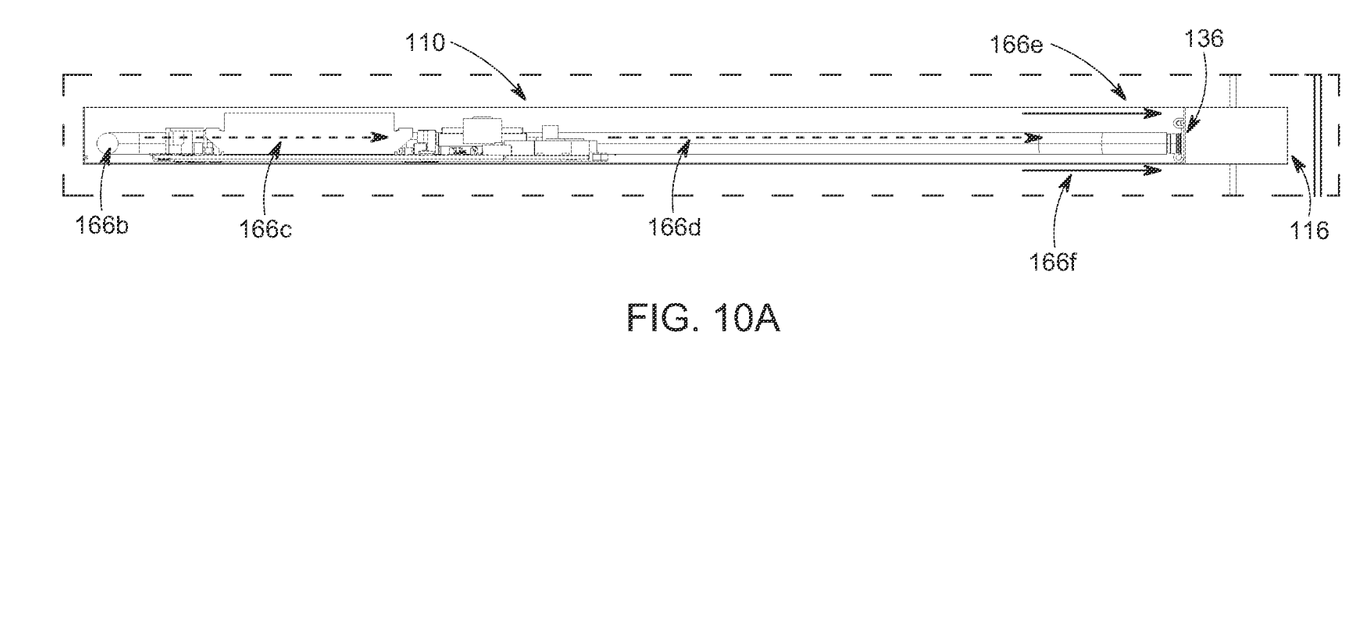
FIG. 10A is a cross-sectional side view along lines "10A"-"10A" of FIG. 3B, according to certain aspects of the present disclosure.
Figure 10B:
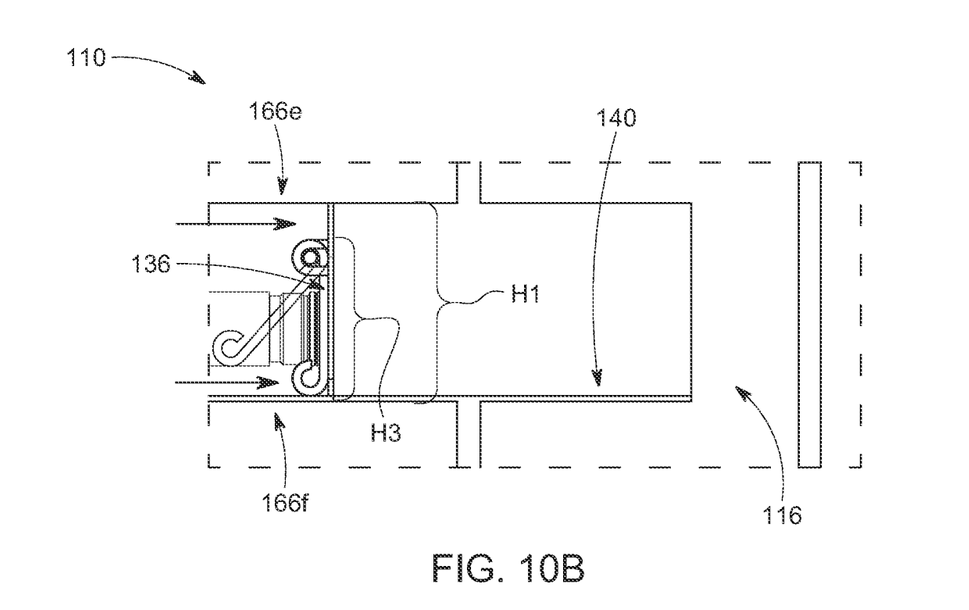
FIG. 10B is an enlarged side view of a drainage area of FIG. 10A, according to certain aspects of the present disclosure.
Figure 10C:
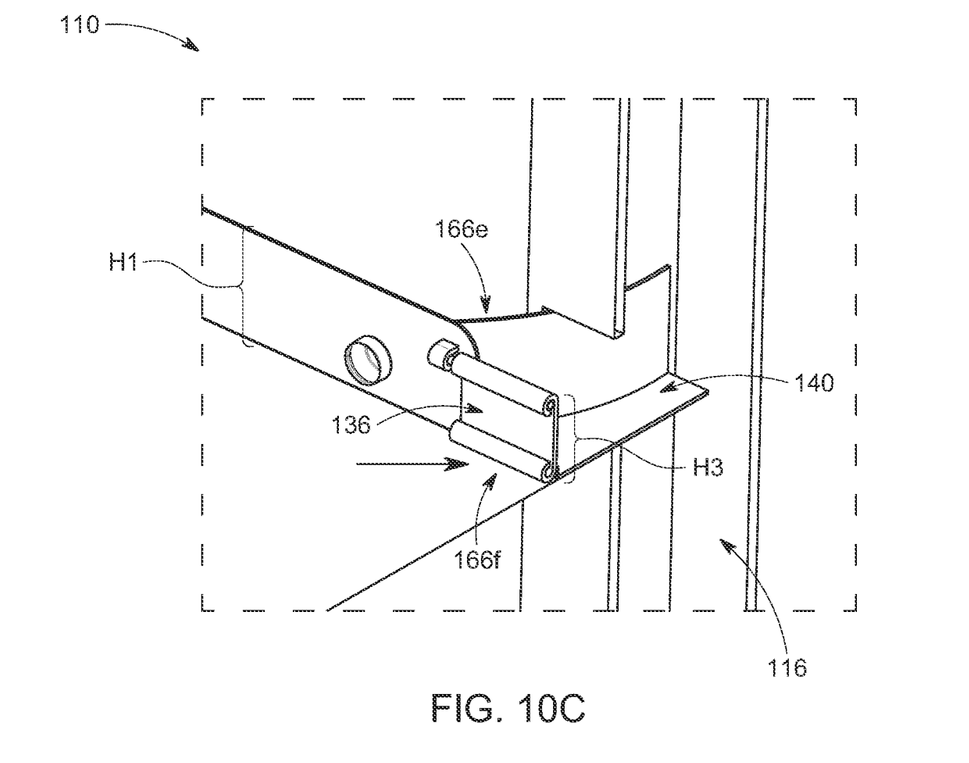
FIG. 10C is an enlarged perspective view of the drainage area of FIG. 10B, according to certain aspects of the present disclosure.

Referring to FIGS. 10A-10C, draining accumulated immersion coolant 166 from the chassis 110 occurs in two ways. A first way is to have overflow of immersion coolant 166 flow along the overflow path 166e, above the flap door 136. The overflow occurs in part based on the difference in height between (a) the height H1 of the chassis 110 and (b) the lower height H3 of the flap door 136. A second way is to drain the accumulated immersion coolant 166 by opening the flap door 136 (illustrated in FIG. 10B). The drainage process typically occurs when one or more components in the chassis 110 requires servicing, which requires removal of the immersion coolant 166. The IT system 100 is generally turned OFF, discontinuing computing operation while servicing occurs. The drainage occurs below the flap door 136 (FIG. 10B), along a drainage path 166f, into the outlet duct 140, and subsequently into the drainage manifold 116.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. An information technology (IT) system with immersion cooling, the IT system comprising:
   a chassis forming an enclosure between an upstream side and a downstream side, the chassis having a rear opening formed along the downstream side, the chassis being configured to hold heat-generating components of the IT system adjacent to the upstream side within the enclosure;
   a supply conduit for delivering an immersion coolant to the upstream side within the enclosure; and a flap mechanism attached to the downstream side near the rear opening, the flap mechanism being movable between an open position and a closed position, the flap mechanism allowing accumulated coolant to drain from the chassis in the open position, the flap mechanism preventing the accumulated coolant from draining from the chassis in the closed position.

2. The IT system of claim 1, wherein the flap mechanism rotates along a pivoting axis to move between the open position and the closed position.

3. The IT system of claim 2, wherein the pivoting axis is along a flap rod attached between two opposing sides of the rear opening.

4. The IT system of claim 1, further comprising a flap handle mechanically coupled to a flap door, the flap handle causing the flap door to rotate when actuated.

5. The IT system of claim 4, wherein the flap handle has a first end that is coupled to a bottom side of the flap door, the flap handle having a second end that protrudes externally from the upstream side.

6. The IT system of claim 5, wherein the flap handle is movable away from the upstream side to cause the flap door to rotate towards the open position resulting in the draining of the accumulated coolant.

7. The IT system of claim 1, further comprising an outlet duct connecting the rear opening to a coolant drainage source.

8. The IT system of claim 1, further comprising a quick-disconnect connector coupling the supply conduit to a coolant supply source.

9. The IT system of claim 8, wherein the quick-disconnect connector is mounted along the downstream side.

10. The IT system of claim 1, wherein the chassis is slidably mounted within a computing rack, the computing rack being configured to house at least one additional chassis.

11. A computing assembly with immersion cooling, the computing system comprising:
a computing rack configured to house a plurality of information technology (IT) systems;
a coolant supply manifold positioned along one end of a downstream side;
a coolant draining manifold positioned along an opposite end of the downstream side; and
a plurality of chassis slidably mounted within the computing rack, each chassis of the plurality of chassis being configured to receive a respective IT system of the plurality of IT systems and form an enclosure between an upstream side and a downstream side, each chassis having
a rear opening formed along the downstream side,
a supply conduit fluidly coupled to the coolant supply manifold for delivering an immersion coolant to the upstream side within the enclosure, and
a flap mechanism attached to the downstream side near the rear opening, the flap mechanism being movable between an open position and a closed position, the flap mechanism allowing accumulated coolant to drain from the respective chassis into the coolant draining manifold in the open position, the flap mechanism preventing the accumulated coolant from draining from the respective chassis into the coolant draining manifold in the closed position.

12. The computing assembly of claim 11, wherein the coolant supply manifold and the coolant draining manifold are mounted generally vertically along the downstream side of the chassis.

13. The computing assembly of claim 11, wherein the coolant supply manifold and the coolant draining manifold are mounted generally parallel to each other along the downstream side of the chassis.

14. The computing assembly of claim 11, wherein each chassis is mounted generally horizontally and in parallel with adjacent chassis in the computing rack.

15. The computing assembly of claim 11, wherein each chassis is configured to hold heat-generating components that include one or more of an application server, a storage server, a computer sever, a storage device, or a network switch.

16. A method for immersion cooling of an information technology (IT) system, the method comprising:
providing a chassis that forms an enclosure between an upstream side and a downstream side, the chassis having a rear opening formed along the downstream side;
receiving heat-generating components of the IT system into the chassis, the heat-generating components being positioned adjacent to the upstream side within the enclosure;
delivering an immersion coolant to the upstream side within the enclosure; and
moving a flap mechanism between an open position and a closed position, the flap mechanism being attached to the downstream side near the rear opening, movement of the flap mechanism
allowing accumulated coolant in the enclosure to drain from the chassis in the open position, and
preventing the accumulated coolant from draining from the chassis in the closed position.

17. The method of claim 16, further comprising rotating the flap mechanism along a pivoting axis.

18. The method of claim 16, further comprising moving a flap handle that is mechanically coupled to a flap door, movement of the flap handle causing the flap door to rotate between the open position and the closed position.

19. The method of claim 16, further comprising draining the accumulated coolant into a draining manifold, the draining manifold being fluidly coupled to the rear opening via an outlet duct.

20. The method of claim 16, further comprising receiving the immersion coolant from a supply manifold, the supply manifold being fluidly coupled to a supply conduit via a quick-disconnect connector.

* * * * *